United States Patent
Hong et al.

(10) Patent No.: US 9,090,499 B2
(45) Date of Patent: Jul. 28, 2015

(54) METHOD AND APPARATUS FOR LIGHT INDUCED ETCHING OF GLASS SUBSTRATES IN THE FABRICATION OF ELECTRONIC CIRCUITS

(71) Applicant: QUALCOMM Incorporated, San Diego, CA (US)

(72) Inventors: John H. Hong, San Clemente, CA (US); Kenji Nomura, San Diego, CA (US); Je-Hsiung Lan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/792,094

(22) Filed: Mar. 10, 2013

(65) Prior Publication Data
US 2014/0251947 A1 Sep. 11, 2014

(51) Int. Cl.
| C23F 1/00 | (2006.01) |
| H01L 21/306 | (2006.01) |
| C03C 15/00 | (2006.01) |
| H01L 21/311 | (2006.01) |
| H01L 21/48 | (2006.01) |
| H05K 3/00 | (2006.01) |

(52) U.S. Cl.
CPC .......... *C03C 15/00* (2013.01); *H01L 21/31111* (2013.01); *H01L 21/31116* (2013.01); *H01L 21/486* (2013.01); *H05K 3/002* (2013.01)

(58) Field of Classification Search
USPC .................................................... 156/345.1
See application file for complete search history.

(56) References Cited

U.S. PATENT DOCUMENTS

| 3,095,332 A | * | 6/1963 | Ligenza ..................... 438/565 |
| 3,122,463 A | * | 2/1964 | Ligenza et al. .............. 438/542 |
| 3,489,564 A | * | 1/1970 | Schaefer ..................... 430/297 |
| 5,363,171 A | * | 11/1994 | Mack .............................. 355/68 |

(Continued)

FOREIGN PATENT DOCUMENTS

| EP | 0688045 A1 | 12/1995 |
| GB | 952543 A | 3/1964 |

(Continued)

OTHER PUBLICATIONS

Bohme R., et al., "Backside etching of UV-transparent materials at the interface to liquids", Applied Surface Science, Elsevier, Amsterdam, NL, vol. 186, No. 1-4, Jan. 28, 2002, pp. 276-281, XP027323255, ISSN: 0169-4332 [retrieved on Jan. 28, 2002].
International Search Report and Written Opinion—PCT/US2014/020882—ISA/EPO—Jun. 18, 2014.

(Continued)

*Primary Examiner* — Keath Chen
(74) *Attorney, Agent, or Firm* — Arent Fox LLP

(57) ABSTRACT

A method of etching a glass substrate using an etchant that is reversibly activated to etch only in precise locations in which such etching is desired and is deactivated when outside of these locations. The method involves exposing a first side of the glass substrate to a mixture of chemical substances that includes a neutralized etchant that is photosensitive. The neutralized etchant is formed by reacting a neutralizer with an etchant. The method also includes transmitting light from a direction of a second side of the glass into the mixture of chemical substances. In response to exposure to this light, the etchant is reversibly released from a bond to the neutralizer to form the etchant on predetermined areas of the first side of the glass, wherein the predetermined areas are defined by the dimension of the light.

24 Claims, 6 Drawing Sheets

(56) References Cited

U.S. PATENT DOCUMENTS

| | | |
|---|---|---|
| 7,049,049 B2 | 5/2006 | Fries |
| 7,763,546 B2 | 7/2010 | Kothari et al. |
| 2004/0229472 A1* | 11/2004 | Kobayashi .................. 438/736 |
| 2011/0091687 A1 | 4/2011 | Haque et al. |
| 2011/0195360 A1 | 8/2011 | Flemming et al. |
| 2012/0235969 A1 | 9/2012 | Burns et al. |

FOREIGN PATENT DOCUMENTS

| | | |
|---|---|---|
| GB | 1220365 A | 1/1971 |
| JP | 2000054169 A | 2/2000 |

OTHER PUBLICATIONS

Golden, et al., "Infrared Multiphoton Decomposition: Photochemistry and Photophysics," Acc. Chem. Res. 1981, 14, pp. 56-62.

* cited by examiner

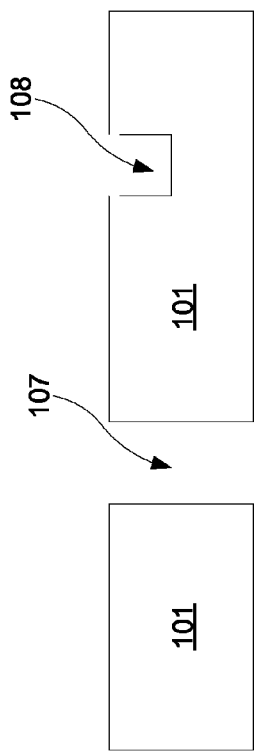
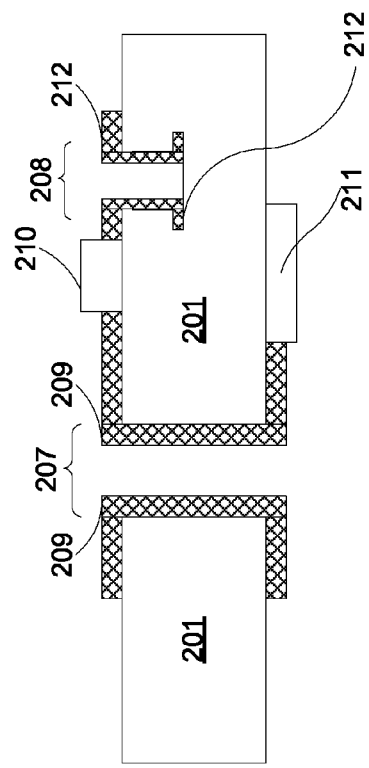
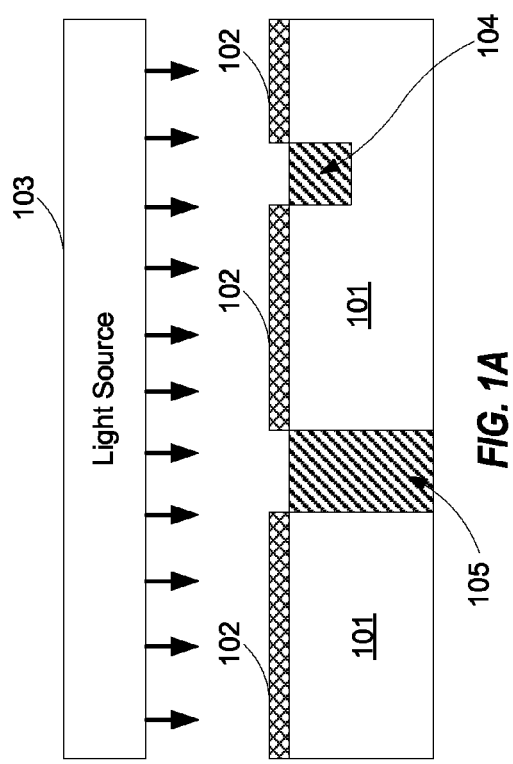
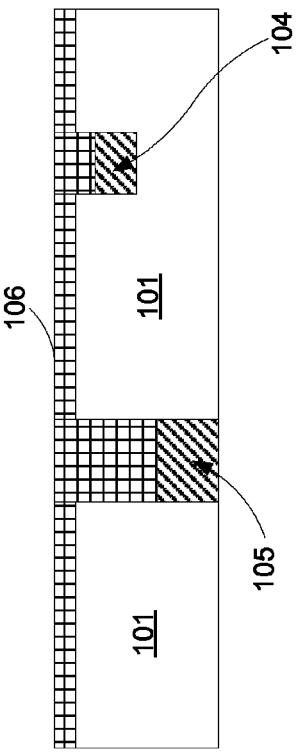
FIG. 1A
FIG. 1B
FIG. 1C
FIG. 2

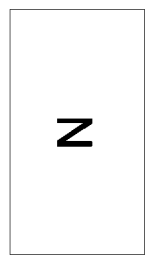
*FIG. 3A*
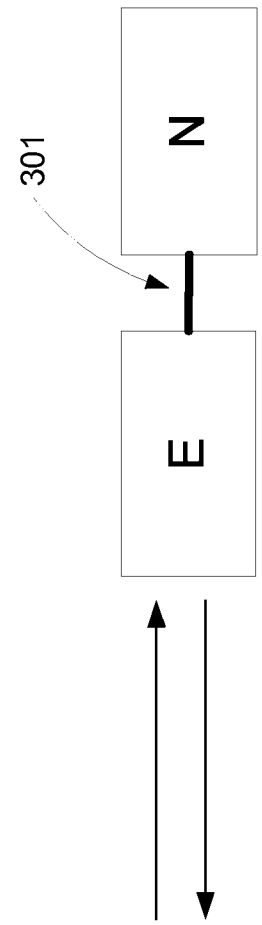
*FIG. 3B*
*FIG. 3C*

METHOD AND APPARATUS FOR LIGHT INDUCED ETCHING OF GLASS SUBSTRATES IN THE FABRICATION OF ELECTRONIC CIRCUITS

BACKGROUND

1. Field

Aspects of the present disclosure relate generally to electronic circuits, and more particularly, to the fabrication of integrated circuits.

2. Background

An integrated circuit is an electronic circuit on a small plate (substrate) and may be found in a wide variety of everyday electronic devices. The substrate of integrated circuits may be composed of various different types of material, such as silicon, gallium-arsenide, and the like. Glass, which has many cost and performance benefits, has also been used as a substrate for certain types of integrated circuits. For example, glass may be used as the substrate on which miniature electrical and optoelectronic devices such as microelectromechanical systems (MEMS) display and radio frequency microelectromechanical systems (RF MEMS) are fabricated. The MEMS and RF MEMS generally include electrical connections through the glass substrate because devices that need to be electrically connected may be located on different sides of the glass substrate. These through-glass electrical connections are desirable because they are shorter than connections that go around the substrate. Shorter electrical connections also provide less resistance and use up less space than longer electrical connections. The through-glass connections are implemented by creating vias or holes running from one side of the glass substrate to the opposite side and coating the side of the vias with conductive material (through via). Further, some vias may facilitate connections between layers in the substrate without going completely through the substrate (blind via).

Methods of creating vias in a glass substrate include sandblasting through the glass, applying laser beams to ablate the glass and constructing the glass with special chemical properties. With respect to the method involving glass with special chemical properties, when areas of the glass are exposed to light those areas turn into etchable material. Subsequently, etchants are used to etch away the etchable material to create vias. These methods, however, have disadvantages. For example, sandblasting may damage the glass and cause localized cracking. The minimum size via achievable by this method is larger than the via size typically desired. With respect to laser, its use is sequential in nature. That is, one hole or a small set of vias are created at a time, which results in a slow process. Finally, the formulation of the glass substrate with special chemical properties that turns it into etchable material when exposed to light usually involves doping the glass with other materials such as metals. This doping is costly and often negatively affects certain other properties of the glass substrate. One example of this negative effect is excessive RF loss.

The importance of the integrated circuits to modern life is reflected by their widespread use, as mentioned above. Coupled with this widespread use is the fact that the fabrication of integrated circuits requires sophisticated machinery, which translates to large capital investments and overall expensive processes. In view of these factors, improvements in techniques used in the fabrication of integrated circuits are particularly desirable.

SUMMARY

Methods and apparatus according to aspects of the disclosure involve the etching of a glass substrate to create features such as vias in the glass substrate by a mechanism that includes an etchant that is reversibly activated to etch only in precise locations in which such etching is desired and is deactivated when outside of these locations.

In one aspect of the disclosure, a method of etching glass with an etchant, includes exposing a first side of the glass to a mixture of chemical substances that includes a neutralized etchant that is photosensitive, the neutralized etchant including a neutralizer bonded with an etchant. The method also includes transmitting light from a direction of a second side of the glass into the mixture of chemical substances, wherein, in response to exposure to the light, the etchant is reversibly released from a bond to the neutralizer to form the etchant on predetermined areas of the first side of the glass.

In an additional aspect of the disclosure, an apparatus configured for etching glass with an etchant, including means for exposing a first side of the glass to a mixture of chemical substances that includes a neutralized etchant that is photosensitive, the neutralized etchant including a neutralizer bonded with an etchant. The apparatus also includes means for transmitting light from a direction of a second side of the glass into the mixture of chemical substances, wherein, in response to exposure to the light, the etchant is reversibly released from a bond to the neutralizer to form the etchant on predetermined areas of the first side of the glass.

In an additional aspect of the disclosure, an apparatus configured for etching glass with an etchant, including an etch chamber for exposing a first side of the glass to a mixture of chemical substances that includes a neutralized etchant that is photosensitive, the neutralized etchant including a neutralizer bonded with an etchant. The apparatus also includes a light source for transmitting light from a direction of a second side of the glass into the mixture of chemical substances, wherein, in response to exposure to the light, the etchant is reversibly released from a bond to the neutralizer to form the etchant on predetermined areas of the first side of the glass.

BRIEF DESCRIPTION OF THE DRAWINGS

FIGS. 1A-1C are block diagrams illustrating an example of liquid chemical etching of a photosensitive glass substrate.

FIG. 2 is a block diagram illustrating an integrated circuit showing a glass substrate with a through via and a blind via.

FIGS. 3A-3C illustrate an example of an etchant.

DETAILED DESCRIPTION

Figure 4:
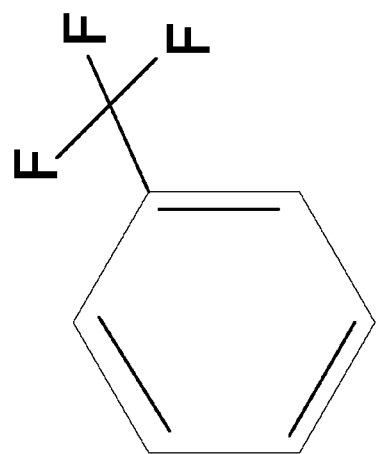
FIG. 4 is a diagram illustrating neutralized etchants according to aspects of the disclosure.
Figure 4:
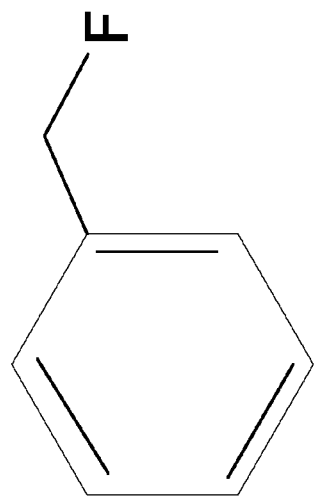
Figure 4:
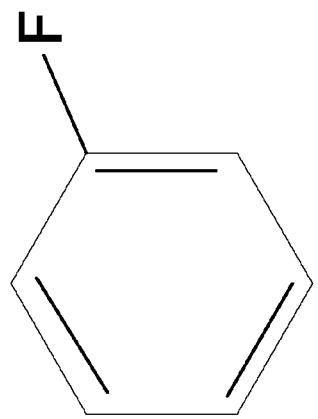

As noted above, the etching of vias in a substrate for the fabrication of integrated circuits, may involve physical and chemical processes that remove substrate material. Some of these processes involve placing a mask on the substrate such that openings in the mask expose areas that are to be etched and cover the areas that are not to be etched. The uncovered areas of the substrate are then exposed to the particular physical or chemical process being used. FIGS. 1A-1C are block diagrams illustrating an example of existing liquid chemical etching of a photosensitive glass substrate. To begin this process, in FIG. 1A, photosensitive glass substrate 101 is covered with mask 102. Light from light source 103 is then projected towards substrate 101 and mask 102. Because glass substrate 101 is photosensitive, the areas of glass substrate 101 that are exposed to light—sections 104 and 105—are transformed into etchable material. In FIG. 1B, mask 102 is removed and liquid chemical 106 is applied to glass substrate 101. Liquid chemical 106 etches sections 105 and 104 but does not have any effect on the other areas of glass substrate 101 that was covered by mask 102. FIG. 1B shows that the etching of sections 105 and 104 is partially complete. FIG. 1C shows glass substrate 101 after the etching process is complete so as to form through via 107 and blind via 108 and that liquid chemical 106 has been removed.

FIG. 2 is a block diagram illustrating an integrated circuit with a glass substrate that has a through via and a blind via. Vias 207 and 208 of FIG. 2 may be made by the process of FIGS. 1A-1C or any of the via fabrication processes according to the concepts disclosed herein. FIG. 2 shows a through-glass via 207, including a conductive thin film 209, in glass substrate 201. MEMS device 210 is formed or otherwise attached to glass substrate 201. Conductive thin film 209 provides a conductive electrical connection through glass substrate 201. In this way, through-glass via 207 provides an electrical connection between MEMS device 210 on one side of glass substrate 201 and a MEMS sensor 211 on the other side of glass substrate 201. Blind via 208 has conductive film 212 that electrically connects MEMS device 210 with a layer within glass substrate 201.

In aspects of the current disclosure, a mixture of chemical substances is used as the etchant. According to aspects of the current disclosure, the etchant is activated by exposure to light. This process is known as photolysis. FIGS. 3A-3C are block diagrams conceptually illustrating an example of an etchant. FIG. 3A shows etchant E in its active state. In its active state, etchant E exhibits etching properties with respect to a substrate. FIG. 3B shows a neutralizer N. Neutralizer N reacts reversibly with etchant E and thereby neutralizes etchant E. FIG. 3C shows etchant E reacting with neutralizer N to form neutralized etchant N-E. Neutralized etchant N-E does not perform an etching function. Notably, FIG. 3C shows that the reaction is reversible. Consistent with this, bond 301 shown between etchant E and neutralizer N may be broken by exposing neutralized etchant N-E to light. In other words, on exposure to light, neutralized etchant N-E disintegrates to form etchant E and neutralizing substance N.

It is important to note that there are some reactions of substances that are activated by light but these reactions are not reversed when the light is removed. Such mechanisms should be contrasted with the above described aspects of the disclosure whereby the reaction that takes place as a result of exposure to light is reversed when the light is removed. The type of light, such as UV light used to break the bond of the neutralized etchant depends on the nature of the neutralized etchant. Particular wavelengths of light may be effective with respect to some neutralized etchants and not to others.

Etchant E may be in the form of molecules and compounds that interact with neutralizer N, which also may be in the form of molecules and compounds. Examples of gaseous or vaporous etchant E include fluorine and chlorine. Depending on the material to be etched, other halogens may be used. Examples of neutralizing gaseous or vaporous substances include aryl compounds such as benzyl, xylyl and tolyl compounds. These aryl compounds may be reacted with fluorine and chlorine to produce neutralized etchants N-E such as aryl fluoride, benzyl fluoride and toluene trifluoride as illustrated in FIG. 4.

Other examples of neutralized etchants include fluorine oxides (e.g. $F_2O$, $F_2O_2$) and interhalogens (e.g. $ClF_3$). It should be noted that the compounds mentioned above are only examples of neutralized etchants that may be used to implement aspects of the disclosure and other compounds may be used.

In determining which compounds would serve as neutralized etchants, according to embodiments of the disclosure, the mechanism of photolysis can be considered. Photolysis (photo dissociation) of a molecule occurs when the molecule is exposed to irradiating light having photon energy larger than the molecule's bond-dissociation energy ("D" (kcal/mol)). Absorption cross section ($cm^2$/mol) is the ability of a molecule to absorb photons of a particular wavelength and polarization. The absorption cross section at a particular photon energy that corresponds to the bond dissociation energy should generally be sufficiently high, to initiate and sustain the photolysis reaction.

According to aspects of the disclosure, the photons used to cause photolysis pass through the glass substrate and enter the etching chamber. In certain aspects of the disclosure, the glass substrates will be 0.5 mm thick or thinner. In such cases, photons in the blue end of the visible spectrum can pass through this glass substrate without being excessively absorbed. Photons having a wavelength of 380 nm (3.26 eV) are high energy (short wave length) photon and could work in these cases. In summary, suitable neutralizer-etchants may be identified by considering the glass substrate (thickness etc.), the wavelength of photons needed in view of the glass substrate, and the bond-dissociation energy of the molecules in question.

Figure 5:
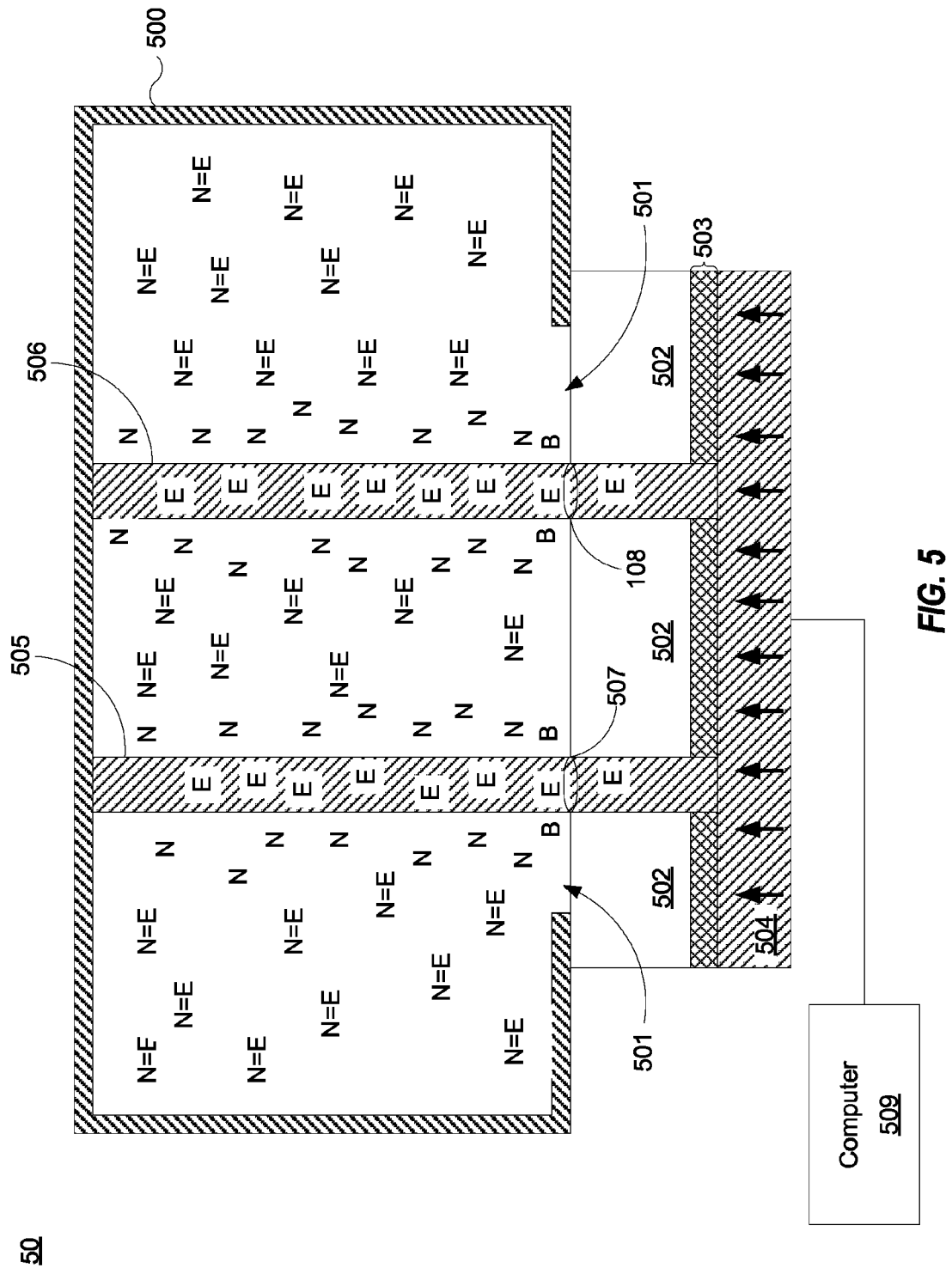
FIG. 5 is a block diagram conceptually illustrating an example of an etching system according to one aspect of the disclosure.

FIG. 5 is a block diagram conceptually illustrating an example of an etching system according to aspects of the current disclosure. Etching system 50 includes etch chamber 500 configured to contain gases such as etchant E, neutralizer N, neutralized etchant N-E and etching byproduct B. Because etchant E, neutralizer N and neutralized etchant N-E are gases or vapors they diffuse randomly with etch chamber 500. Etch chamber 500 includes opening 501. Covering this opening is glass substrate 502. Glass substrate 502 is to be etched so as to have certain features such as vias in particular locations. In aspects of the disclosure, glass substrate may be less than or about ½ mm thick and the holes to be etched in it has a diameter of less than or about 5 microns. Such dimensions are only an example, and the various aspects of the disclosure are not limited to any particular dimension of glass substrate. Patterned photoresist 503 is a mask placed adjacent the side of glass substrate 502 that is opposite the side of glass 502 exposed to the gas mixture in etch chamber 500. Light source 504 produces light rays traveling towards patterned photoresist 503. Light passes through the holes in patterned photoresist 503, through glass substrate 502 and into etch chamber 500 via paths 505 and 506 (light that is spatially modulated). In addition to pre-patterned photoresist, spatially patterned light may be achieved by maskless methods. Paths 505 and 506 are volumes of space defined by the shape of the holes in patterned photoresist 503. For example, if the holes in patterned photoresist are circular, then paths 505 and 506 would be cylindrical volumes within etch chamber 500.

As illustrated, within etch chamber 500, along paths 505 and 506, there is a concentration of etchant E. This is so because as the neutralized etchant N-E moves into paths 505 and 506, the light impinges on neutralized etchant N-E and disintegrates into neutralizer N and etchant E. As etchant E disperses away from areas 505 and 506, etchant E is no longer exposed to light and reacts with neutralizer N and thereby reforms neutralized etchant N-E. In this regard, according to aspects of the disclosure neutralizer N is available in abundant amounts in etch chamber 500 to react with etchant E when etchant E is not exposed to light. In other words, the amount of neutralizer N in etch chamber 500 is kept at a level in excess of what is required to react with all of etchant E that is in etch chamber 500. In this way, etchant E (the active state) is not found outside of paths 505 and 506. Instead, etchant E is found in found in paths 505 and 506 only as neutralized etchant N-E (the inactive state).

Because etchant E is present in paths 505 and 506 only within etch chamber 500, etchant E contacts glass substrate 502 at areas 507 and 508 only. For example, if paths 505 and 506 are cylindrical volumes, then etchant E will etch glass substrate 502 to create a cylindrical opening. As can be appreciated, the shape of the opening etched depends on the shape of paths 505 and 506, which, in turn, is controlled by the shape of the openings in patterned photoresist 503 that allows light to pass through it into glass substrate 502 and etch chamber 500. In other words, spatial light patterns formed on photoresist 503 on one side of glass substrate 502 or formed without a photoresist using directly patterned light or scanned laser beams creates an etch pattern on the opposite of glass substrate 502. Accordingly, etching occurs in areas 507 and 508 and continues down into glass substrate 502. The etching process also produces etch by-product B which is a product of the chemical reaction between etchant E and glass substrate 502. When the etching process is complete, for example when the openings (e.g. vias) are fully formed, the light source may be turned off so as to cause all etchant E in etch chamber 500 to react with neutralizer N and thereby terminate the etching process. It should be noted that though FIG. 5 has been described with respect to a mixture of chemical substances that is gas or vapor, aspects of the disclosure may be implemented with the mixture of chemical substances being a liquid.

Figure 6:
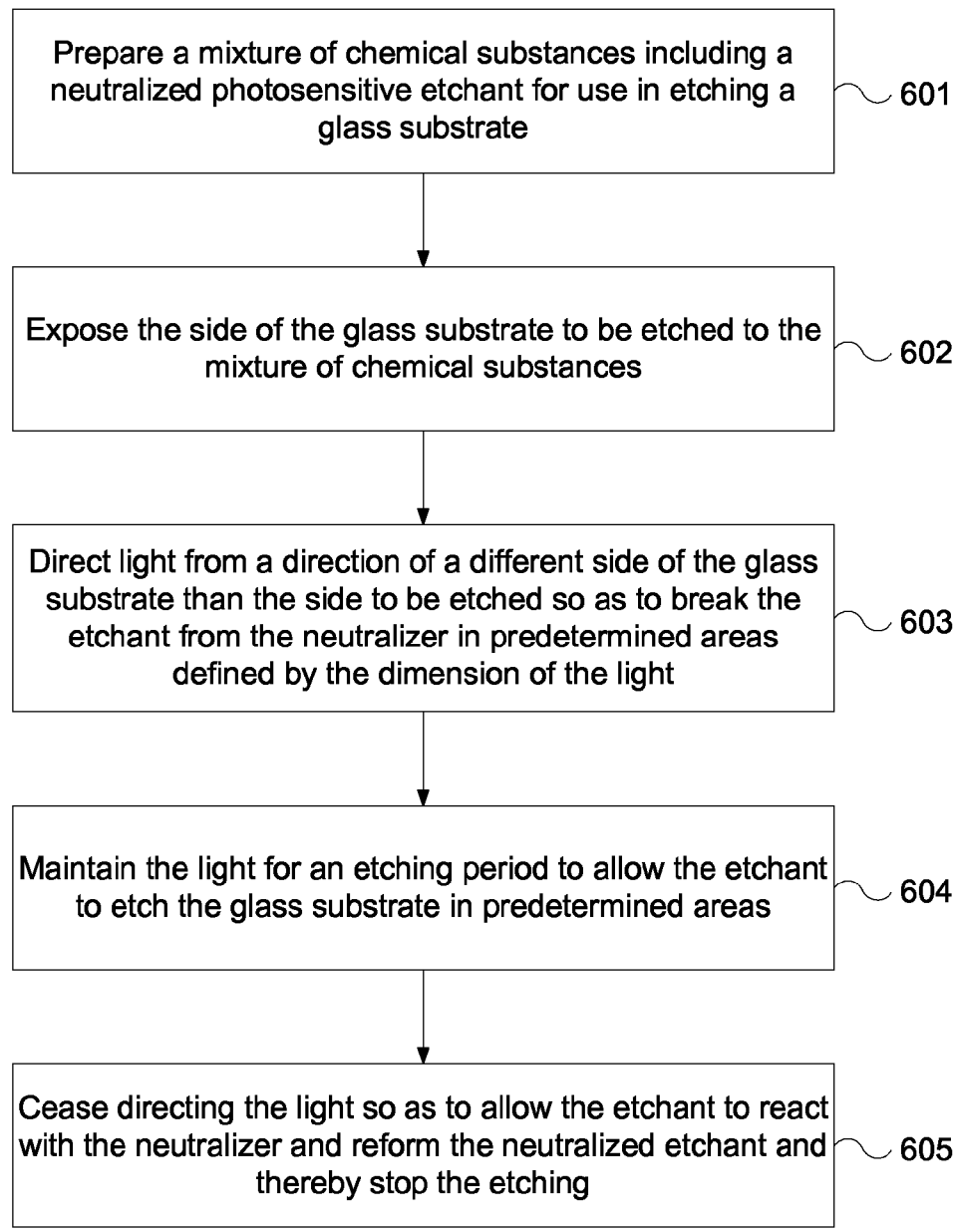
FIG. 6 is a functional block diagram conceptually illustrating example blocks executed to implement one aspect of the disclosure.

FIG. 6 is a functional block diagram conceptually illustrating example blocks executed to implement etching of a glass substrate according to aspects of the disclosure. Block diagram 60 begins at block 601, which involves preparing a mixture of chemical substances for use in etching the glass substrate. The mixture of chemical substances is prepared by reacting an amount of etchant E with an amount of neutralizer N. The amount of neutralizer N is in excess of what is required to completely react with the amount of etchant E. As described above, the reaction of etchant E with neutralizer N forms neutralized etchant N-E. Neutralized etchant N-E is photo-sensitive and disintegrates into neutralizer N and etchant E on exposure of neutralized etchant N-E to light. Based on this reversible reaction, when the mixture of chemical substances is not exposed to light, it includes neutralized etchant N-E and an excess amount of neutralizer N. On the other hand, when the mixture of chemical substances is exposed to light, it includes etchant E (in areas where the light impinges), neutralized etchant N-E (in areas not exposed to light) and neutralizer N in both areas.

At block 602, the glass substrate to be etched (e.g. glass substrate 502, FIG. 5) is exposed to the mixture of chemical substances. This may be done by placing glass substrate 502 at opening 501 of etch chamber 500 and then injecting a prepared mixture of chemical substances of neutralizer N and neutralized etchant N-E into etch chamber 500. Of course, the exposure of the mixture of chemical substances could be done in a different manner such as adding the mixture of chemical substances first to etch chamber 500 and then using glass substrate 502 to replace other material used to seal opening 501. In aspects of the disclosure, the exposure of glass substrate 502 to the mixture of chemical substances is done in the dark so as to prevent premature and uncontrolled etching of glass substrate 502.

Once glass substrate 502 is exposed to the mixture of chemical substances, the etching of the glass may begin. To do so, at block 603, light is directed from a direction of a different side of glass substrate 502 than the side to be etched. In this way, etchant E is reversibly released from its bond with neutralizer N in predetermined areas defined by the dimension of the light such as paths 505 and 506. As such, etchant E begins to etch areas 507 and 508 of glass substrate 502 where paths 505 and 506 interface glass substrate 502. As noted, the dimension of the light may be determined by forming a pattern, such as by placing patterned photoresist 503, on the side of the glass different from the side being etched. As such, patterned photoresist 503 allows light to enter etch chamber 500 only in certain predetermined areas. It should be noted that other means of directing the light in certain predetermined areas other than patterned photoresist 503 may be used in aspects of the disclosure. For example, as presented above, directly patterned light or scanned laser beams may be used to create an etch pattern on the opposite of glass substrate 502

At block 604, the light is maintained for an etching period to allow the etchant to begin etching the glass substrate in areas 507 and 508. When glass substrate 502 has been sufficiently etched, block 605 provides for ceasing the direction of light into etch chamber 500 so as to allow etchant E to react with neutralizer N and thereby reform the neutralized etchant. This stops the etching process.

In aspects of the disclosure, block 604 is carried out until etchant E completely etches through glass substrate 502. This would be the case, for example, when a through via is being created. After the etching the through via, it may be metallized, as is known in the art. An example of a metallized through via is via 207 of FIG. 2.

In aspects of the disclosure, a blind via may be made by carrying out block 604 for an etch period that is less than the minimum required time for etching a through via. In this way, the via does not go completely through glass substrate 502. Like the through via, the blind via may be metallized. An example of a metallized blind via is via 208 of FIG. 2.

Although aspects of the present disclosure have been described with reference to the blocks of FIG. 6, it should be appreciated that operation of the present disclosure is not limited to the particular blocks and/or the particular order of the blocks illustrated in FIG. 6. Accordingly, aspects of the disclosure may provide functionality as described herein using various blocks in a sequence different than those of FIG. 6. For example, controlled directing of light as described with respect to block 603 may be performed before exposing the glass substrate to the mixture of chemical substances as described at block 602.

Figure 7:
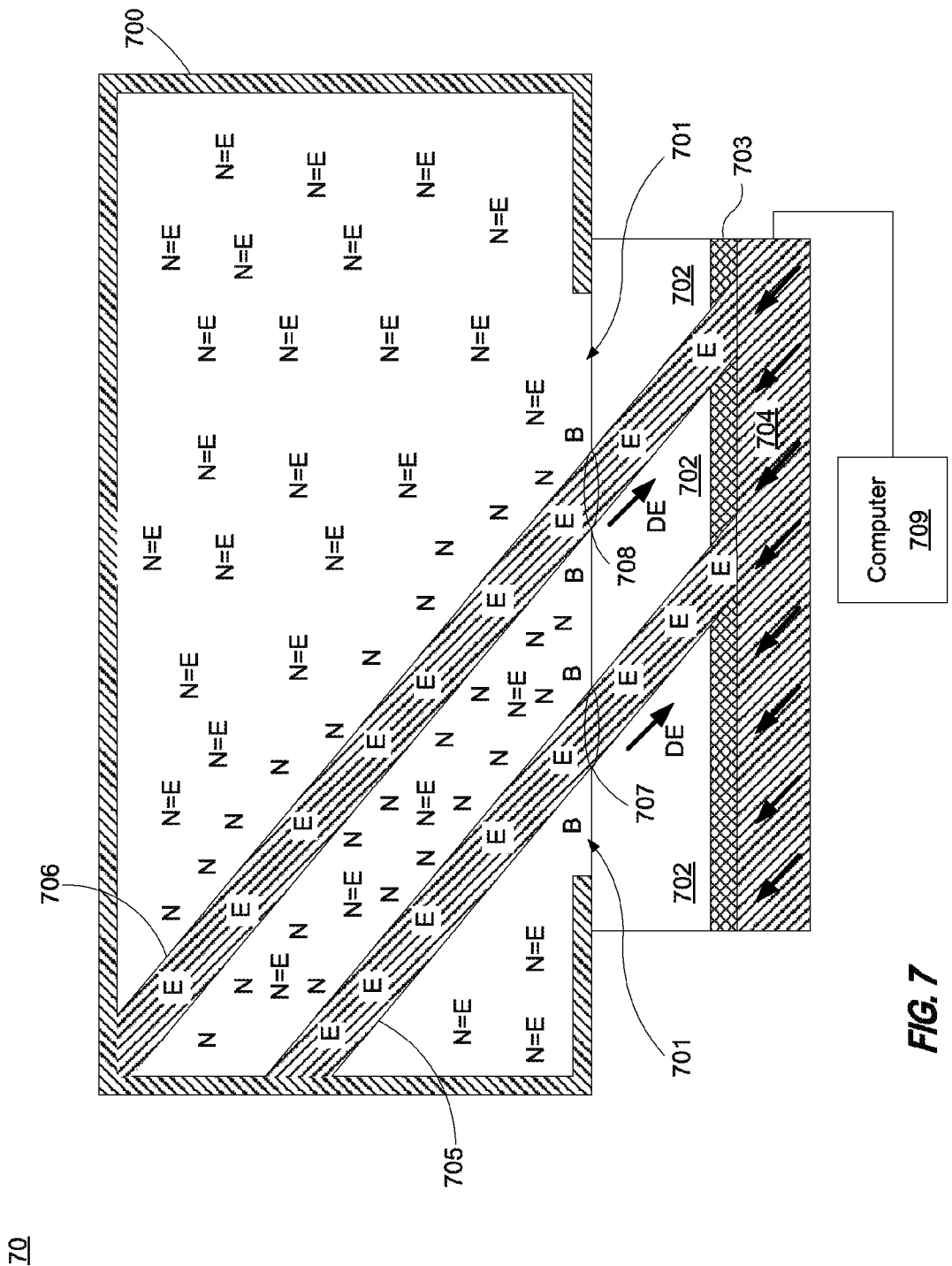
FIG. 7 is a block diagram conceptually illustrating an example of an etching system according to one aspect of the disclosure.

It should also be noted that in aspects of the disclosure, non-vertical vias may be created in a glass substrate. FIG. 7 shows an etching system that may be used in creating non-vertical vias according to aspects of the disclosure. Etching system 70 is similar to system 50. Thus etch chamber 700 and opening 701 are similar to etch chamber 500 and opening 501 of etching system 50. However, non-vertical vias are desired in glass substrate 702. To achieve this, light source 704 or patterned photoresist 703, or both, are configured so that the light rays pass through glass substrate 702 and etch chamber 700 non-vertically. Because of this, paths 705 and 706 are non-vertical. That is, etchant E is disposed in a non-vertical manner consistent with the path of the light rays. Glass substrate 702 is therefore etched in the direction shown DE. In effect, in aspects of the disclosure, the light rays not only control the activation of the etchant material but also controls the direction of etching into the glass substrate.

As can be appreciated, by changing the shape or direction or both of the light path through the glass substrates and etch chambers of etch systems 50 and 70, the shape and configuration of the hole being etched in the glass substrate can be controlled. As such, the present disclosure may include an etch system that is configured to providing different types of etching (e.g. etching as shown in etching systems 50 and 70) and thereby provide a way to easily control various designs, shapes or dimensions of vias or other features produced by etching of a glass substrate. For example, with such a configurable etch system, a via may be etched to have a vertical portion, a non-vertical portion, a concave portion, a convex portion, other shapes and combinations thereof.

In aspects of the disclosure, the operation of light source 504 may be controlled by signals from computers 509 and 709. In this way the etch period may be controlled by computers 509 and 709. Further, computers 509 and 709 may precisely control the direction etching and the shape of the etched feature in various portions of glass substrate 502 and 702 by controlling the direction of the light. Further, computers 509 and 709 may be used to control movement of one or more patterned photoresists 503 and 703 to control the direction etching and the shape of the etched feature in various sections of glass substrates 502 and 702 respectively. In aspects of the disclosure, the combined effect of computers 509's and 709's control of light sources 504 and 704 respectively and patterned photoresist 503 and 703 respectively implements the desired direction etching and shape of the etched feature.

While aspects of the disclosure have been described with respect to etching vias, it should be noted that aspects of the disclosure may also include etching other features such as depressions on a glass substrate for other purposes in making integrated circuits. For example, the depressions may be etched and then material (e.g. conductive material) later deposited in these depressions.

In view of the above described disclosure being used to etch glass substrates for fabrication of integrated circuits, aspects of the disclosure include electronic devices that include integrated circuits fabricated in part by the use of the techniques described herein. Such electronic devices include computers, video camcorders, televisions, radios, cameras, telephones and the like.

As can be appreciated, the disclosure herein provides various improvements over the existing art. For example, the activation and deactivation of the etchant by light exposure enables better control over which areas of the glass substrate gets etched. In this way, various designs, shapes or configurations of the features being etched may be achieved. Further, as compared to the etching based on doping the glass substrate to be photosensitive, the current disclosure avoids the doping of glass and the problems associated with such a procedure (e.g. RF loss). Moreover, doping the glass involves doping all the glass and then using light to act on only certain areas of the glass. In effect, the material used to dope the areas not affected by the light has been wasted and merely remains in the glass to cause the previously mentioned deleterious effects. In contrast, according to aspects of the disclosure, the etchant is activated and used only where it is needed and unused etchant that remains in the chamber can be used for another glass substrate. Further, regular (cheaper) glass may be used in aspects of the disclosure. Furthermore, because aspects of the disclosure involve light activating a neutralized etchant to become an active etchant, the size of the hole being etched can be very small and uniform as established by the size and consistency of the path of the light ray used. In sum, the present disclosure provides a more efficient and precision controlled method of etching glass substrates to form features such as vias.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

FIG. 5 is a block diagram conceptually illustrating a system for etching glass with an etchant. Etch chamber 500 provides means for exposing a first side of the glass to a mixture of chemical substances that includes a neutralized etchant that is photosensitive, the neutralized etchant including a neutralizer bonded with an etchant. Light source 504 and patterned photoresist 503 provide means for directing light from a direction of a second side of the glass into the mixture of chemical substances, wherein, in response to exposure to the light, the etchant is reversibly released from a bond to the neutralizer to form the etchant on predetermined areas of the first side of the glass. Patterned photoresist 503 provides means for forming a pattern on the second side of the glass, wherein the light is transmitted through the pattern to define the predetermined areas. Computer 509 and light source 504 provide means for maintaining the light for an etching period to allow the etchant to etch the glass in the predetermined areas. Computer 509 and light source 504 provide means for ceasing the transmission of the light, wherein, in response to the ceasing of the transmission of the light, the etchant reacts with the neutralizer to reform the neutralized etchant that stops the etching.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functional blocks and modules in FIG. 6 may comprise processors, electronics devices, hardware devices, electronics components, logical circuits, memories, software codes, firmware codes, etc., or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus configured for etching a glass substrate with etchant, comprising:
    a chemical source having a mixture of chemical substances that includes a gaseous neutralized etchant that is photosensitive, the gaseous neutralized etchant including a neutralizer bonded with an etchant, wherein the mixture of chemical substances also includes additional neutralizer unbonded with the etchant;
    an etch chamber for exposing a first side of the glass substrate to the mixture of chemical substances; and
    a light source for transmitting light from a direction of a second side of the glass substrate into the mixture of chemical substances, wherein, in response to exposure to the light, the etchant is reversibly released from a bond with the neutralizer to form the etchant on predetermined areas of the first side of the glass substrate, wherein the second side of the glass substrate is not in contact with the mixture of chemical substances.

2. The apparatus of claim 1, further comprising:
    a patterned photoresist for forming a pattern on the second side of the glass substrate, wherein the light is transmitted through the pattern to define the predetermined areas.

3. The apparatus of claim 2, wherein the light transmitting through the pattern creates a dimension of the light, and further wherein the dimension is associated with the predetermined areas.

4. The apparatus of claim 1, further comprising:
    a computer for maintaining the light for an etching period to allow the etchant to etch the glass substrate in the predetermined areas.

5. The apparatus of claim 4, wherein the glass substrate is etched to form any of the list consisting of: a through-via, a blind via and a depression.

6. The apparatus of claim 1, wherein the mixture of chemical substances also includes additional neutralizer, and further wherein an amount of neutralizer in the mixture of chemical substances always exceeds an amount of etchant in the mixture of chemical substances.

7. The apparatus of claim 1, wherein the first side of the glass substrate is opposite the second side of the glass substrate.

8. The apparatus of claim 1, further including:
    a computer for ceasing the transmission of the light, wherein, in response to the ceasing of the transmission of the light, the etchant reacts with the neutralizer to reform the gaseous neutralized etchant.

9. An apparatus configured for etching a glass substrate with an etchant, comprising:
    a chemical source having a mixture of chemical substances that includes a gaseous neutralized etchant that is photosensitive, the gaseous neutralized etchant including a neutralizer bonded with an etchant, wherein the mixture of chemical substances also includes additional neutralizer unbonded with the etchant;
    means for exposing a first side of the glass substrate to the mixture of chemical substances; and
    means for transmitting light from a direction of a second side of the glass substrate into the mixture of chemical substances, wherein, in response to exposure to the light, the etchant is reversibly released from a bond with the neutralizer to form the etchant on predetermined areas of the first side of the glass substrate, wherein the second side of the glass substrate is not in contact with the mixture of chemical substances.

10. The apparatus of claim 9, further comprising:
means for forming a pattern on the second side of the glass substrate, wherein the light is transmitted through the pattern to define the predetermined areas.

11. The apparatus of claim 10, wherein the light transmitting through the pattern creates a dimension of the light, and further wherein the dimension is associated with the predetermined areas.

12. The apparatus of claim 9, further comprising:
means for maintaining the light for an etching period to allow the etchant to etch the glass substrate in the predetermined areas.

13. The apparatus of claim 12, wherein the glass substrate is etched to form any of the list consisting of a through-via, a blind via and a depression.

14. The apparatus of claim 9, wherein the mixture of chemical substances also includes additional neutralizer, and further wherein an amount of neutralizer in the mixture of chemical substances always exceeds an amount of etchant in the mixture of chemical substances.

15. The apparatus of claim 9, wherein the first side of the glass substrate is opposite the second side of the glass substrate.

16. The apparatus of claim 9, further including:
means for ceasing the transmission of the light, wherein, in response to the ceasing of the transmission of the light, the etchant reacts with the neutralizer to reform the gaseous neutralized etchant.

17. A method of etching a glass substrate with an etchant, comprising:
introducing a mixture of chemical substances into a chemical source, the mixture of chemical substances including a gaseous neutralized etchant that is photosensitive, the gaseous neutralize etchant including a neutralizer bonded with an etchant, wherein the mixture of chemical substances also includes additional neutralizer unhanded with the etchant;
exposing a first side of the glass substrate to the mixture of chemical substances; and
transmitting light from a direction of a second side of the glass substrate into the mixture of chemical substances, wherein, in response to exposure to the light, the etchant is reversibly released from a bond with the neutralizer to form the etchant on predetermined areas of the first side of the glass substrate, wherein the second side of the glass substrate is not in contact with the mixture of chemical substances.

18. The method of claim 17, further comprising:
forming a pattern on the second side of the glass substrate, wherein the light is transmitted through the pattern to define the predetermined areas.

19. The method of claim 18, wherein the light transmitting through the pattern creates a dimension of the light, and further wherein the dimension is associated with the predetermined areas.

20. The method of claim 17, further comprising:
maintaining the light for an etching period to allow the etchant to etch the glass substrate in the predetermined areas.

21. The method of claim 20, wherein the glass substrate is etched to form any of the list consisting of: a through-via, a blind via and a depression.

22. The method of claim 17, wherein the mixture of chemical substances also includes additional neutralizer, and further wherein an amount of neutralizer in the mixture of chemical substances always exceeds an amount of etchant in the mixture of chemical substances.

23. The method of claim 17, wherein the first side of the glass substrate is opposite the second side of the glass substrate.

24. The method of claim 17, further including:
ceasing the transmission of the light, wherein, in response to the ceasing of the transmission of the light, the etchant reacts with the neutralizer to reform the gaseous neutralized etchant.

* * * * *